United States Patent
Lung (10) Patent No.: US 9,449,720 B1
(45) Date of Patent: Sep. 20, 2016

(54) DYNAMIC REDUNDANCY REPAIR

(71) Applicant: MACRONIX INTERNATIONAL CO., LTD., Hsinchu (TW)

(72) Inventor: Hsiang-Lan Lung, Ardsley, NY (US)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/943,366

(22) Filed: Nov. 17, 2015

(51) Int. Cl.
*G11C 29/00* (2006.01)
*G11C 7/00* (2006.01)
*G11C 16/08* (2006.01)
*G11C 16/34* (2006.01)

(52) U.S. Cl.
CPC .............. *G11C 29/76* (2013.01); *G11C 16/08* (2013.01); *G11C 16/3404* (2013.01); *G11C 16/3459* (2013.01)

(58) Field of Classification Search
CPC . G11C 13/0033; G11C 16/06; G11C 13/004; G11C 13/0064; G11C 7/00; G11C 29/00; G11C 29/76; G11C 8/00
See application file for complete search history.

(56) References Cited

U.S. PATENT DOCUMENTS

| | | | |
|---|---|---|---|
| 5,917,764 A | 6/1999 | Ohsawa et al. | |
| 6,115,828 A | 9/2000 | Tsutsumi et al. | |
| 8,238,149 B2 * | 8/2012 | Shih | G11C 13/0004 365/148 |
| 8,977,912 B2 | 3/2015 | Hung et al. | |
| 2002/0003741 A1 * | 1/2002 | Maesako | G11C 7/103 365/230.03 |
| 2005/0024956 A1 | 2/2005 | Tran et al. | |
| 2005/0128830 A1 * | 6/2005 | Nishihara | G11C 29/44 365/200 |
| 2007/0047347 A1 | 3/2007 | Byun et al. | |
| 2010/0328995 A1 * | 12/2010 | Shih | G11C 13/0004 365/163 |
| 2014/0082453 A1 * | 3/2014 | Sikdar | G11C 29/808 714/763 |

OTHER PUBLICATIONS

Jiang, et al., "Enhancing Phase Change Memory Lifetime through Fine-Grained Current Regulation and Voltage Upscaling," Proc. of 17th IEEE/ACM Int'l Sump. on Low-Power Electronics and Design, Aug. 1-3, 2011, pp. 127-132.
Schechter, et al., "Use ECP, not ECC, for Hard Failures in Resistive Memories," ACM SIGARCH Computer Architecture News, vol. 38, No. 3, Jun. 2010, 12 pages.

* cited by examiner

*Primary Examiner* — Hien Nguyen
(74) *Attorney, Agent, or Firm* — Haynes Beffel & Wolfeld LLP (57) ABSTRACT

The disclosed memory device technology for implementing dynamic device repair includes a memory array, a redundancy array and a redundancy mapping store. The memory array includes memory cells and the redundant array includes redundancy cells. The memory device also includes circuitry configured to execute a write operation and a read operation in response to respective commands, using a dynamic redundancy repair method to replace the temporary defective cells in the memory array with the redundancy cells in the redundancy array.

20 Claims, 8 Drawing Sheets

DYNAMIC REDUNDANCY REPAIR

TECHNICAL FIELD

The present invention relates to memory devices having redundancy cells that replace defective non-volatile memory cells, and particularly relates to dynamic redundancy repair technology.

BACKGROUND

Error Correction Code (ECC) techniques are commonly used in read operations of memory systems to detect errors in the data and to correct the errors. The general idea for achieving error detection and correction is to add some extra data to a message, which receivers can use to check consistency of the delivered data, and to recover data determined to be corrupted. ECC techniques are used to add correction bits to a group of data bits to detect and/or correct errors. These techniques require an additional status bit (also called a polarity bit or flip bit) for indicating whether the data is correct. If an error occurs in this status bit then the data bits that correspond to this status bit will be in error. For example, this becomes especially critical when ECC techniques are employed for eliminating the effects of errors caused by limited write endurance of phase change memories. Thus, an error that occurs in the status bit is catastrophic compared to an error that occurs in the data bits, making it challenging to read data from phase change memories using ECC techniques in situations in which the resistance level of the status bit is drifting.

It is desirable to provide a repair technology appropriate for phase change memories so that no ECC techniques will be needed in the read operation.

SUMMARY

The disclosed memory device technology for implementing dynamic device repair includes a memory array, a redundancy array and a redundancy mapping store. The memory device includes circuitry coupled to the memory array and the redundancy array—that executes a write operation and a read operation in response to respective commands. For the write operation, the circuitry is configured to write a data value having a selected address in the memory array whether or not there is a valid entry for the selected address in the redundancy mapping store; to apply a write/verify cycle to a memory cell in the memory array having the selected address; and if the selected memory cell fails verify, then the circuitry is configured to write the data value to a redundancy cell in the redundancy array, and to update, change or write an entry to the redundancy mapping store to map the selected address to the redundancy cell. In the read operation, the circuitry is configured to read a data value having a selected address from the memory array if there is no valid entry for the selected address in the redundancy mapping store. The circuitry is configured to read a data value from the redundancy array if there is a valid entry in the redundancy mapping store for the selected address.

Technology described herein also includes a dynamic redundancy repair method of writing and reading a memory device comprising: writing a data value having a selected address in the memory array whether or not there is a valid entry for the selected address in the redundancy mapping store, and if the selected memory cell fails verify then writing the data value to a redundancy cell in the redundancy array, and updating, changing or writing an entry to the redundancy mapping store to map the selected address to the redundancy cell; and reading a data value having the selected address from the memory array if there is no valid entry for the selected address in the redundancy mapping store, or reading a data value from the redundancy array if there is a valid entry in the redundancy mapping store for the selected address.

Other aspects and advantages of the present technology can be seen on review of the drawings, the detailed description and the claims, which follow.

DETAILED DESCRIPTION

A detailed description of embodiments of the present technology is provided with reference to the figures. It is to be understood that there is no intention to limit the technology to the specifically disclosed structural embodiments and methods but that the technology may be practiced using other features, elements, methods and embodiments. Preferred embodiments are described to illustrate the present technology, not to limit its scope, which is defined by the claims. Those of ordinary skill in the art will recognize a variety of equivalent variations on the description that follows. Like elements in various embodiments are commonly referred to with like reference numerals.

Figure 1:
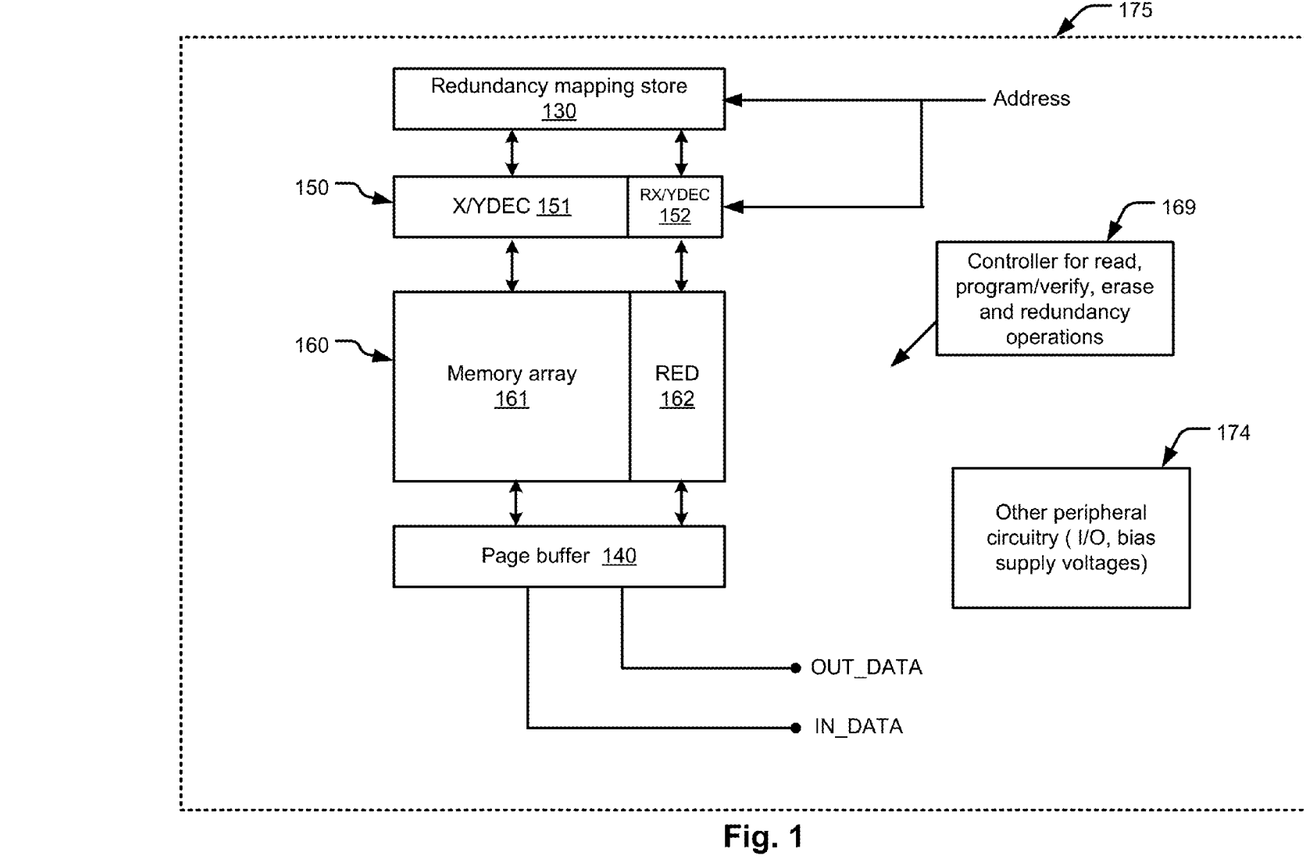
FIG. 1 is a block diagram of a memory device according to one embodiment of the present invention.

FIG. 1 is a simplified block diagram of a memory according to one embodiment. In this example, the memory device 175 includes an array 160 which comprises a memory array 161 of memory cells and a redundancy array 162 (RED) of redundancy cells. The memory and redundancy cells can be nonvolatile NAND flash memory cells, NOR flash memory cells, or memory cells based on other nonvolatile memory technologies.

To repair a defective location in the memory array 161 and provide redundancy for the defective location, the redundancy array 162 is used to store data for defective locations in the memory array 161. The defective locations of the memory array 161 are replaced with the redundancy cells, and the address of the defective location in the memory array 161 is mapped to a redundancy address in the redundancy array 162.

Defective locations can be permanent or temporary. Permanent defective memory cells may result from structural defects, such as irregular shapes of the cells or bad contacts between wires, electrodes, memory elements, access devices, and combinations thereof, and these cells can be inspected and identified during manufacturing of the memory device 175. Temporary defective memory cells may result from incomplete SET/RESET operations, and these cells can pass verify during inspection and therefore not be identified during manufacturing of the memory device 175. Herein, 'hard fail bits' refers to permanent defective memory cells, and 'soft fail bits' refers to temporary defective memory cells. Hard fail bits and soft fail bits in the memory array 161 can be replaced with the redundancy cells in the redundancy array 162.

An address decoder 150 is coupled to array 160 and includes memory address decoders 151 (X/YDEC) and redundancy address decoders 152 (RX/YDEC), decoding the supplied addresses and selecting corresponding cells in the array 160. Addresses can be supplied to, or produced in the memory device 175 and provided to the address decoder 150.

Address decoder 150 is also coupled to redundancy mapping store 130 which has entries to map addresses of memory cells (hard fail bits and soft fail bits) to addresses of redundancy cells, and performs the address lookup function. Redundancy mapping store 130 uses enable-disable logic to read data from the memory array 161, enables memory address decoders 151 and disables redundancy address decoders 152 when there is no valid entry in redundancy mapping store 130. No valid entry means no entry or an entry marked invalid.

On the other hand, when there is a valid entry in the redundancy mapping store 130, the data is read from the redundancy array 162 by disabling the memory address decoders 151 and enabling redundancy address decoders 152. Redundancy mapping store 130 can include a content addressable memory (CAM), look-up table, redundancy table or register bank.

Circuitry included in the memory device 175 is coupled to the memory array 161 and the redundancy array 162, to execute write operations and read operations in response to respective commands. A write operation includes writing a data value having a selected address in the memory array 161 whether or not there is a valid entry for the selected address in the redundancy mapping store 130; applying a write/verify cycle to the memory cell in the memory array 161 having the selected address; and if the selected memory cell fails verify, then writing the data value to a redundancy cell in the redundancy array 162 and updating, changing or writing an entry to the redundancy mapping store 130 to map the selected address to the redundancy cell. The read operation includes reading a data value having a selected address from the memory array 161 if there is no valid entry for the selected address in the redundancy mapping store 130, or reading a data value from the redundancy array 162 if there is a valid entry in the redundancy mapping store 130 for the selected address.

The write operation further includes removing or marking invalid any entry in the redundancy mapping store 130 for the selected address, if the selected memory cell passes verify. Thus, the redundancy cell mapped to the selected address can be used to store another data value for a different address. In a subsequent write operation to the selected address in the memory array, the circuitry applies a write/verify cycle to the memory cell in the memory array having the selected address, and if the selected memory cell passes verify, then removes or marks invalid the entry in the redundancy mapping store for the selected address.

A second write operation includes writing a second data value having the same selected address as in the last write operation in the memory array 161 whether or not there is a valid entry for the selected address in the redundancy mapping store 130, and applying a write/verify cycle to the memory cell in the memory array 161 having the selected address. If the selected memory cell fails verify, in one example implementation, because the redundancy cell can be re-writable, the second write operation includes writing the second data value to the same redundancy cell that stored the data value in the most recent write operation to the selected address. The redundancy cells in the redundancy array can be re-written, so as to store data values for the same or different selected addresses in the memory array as compared to previous write operations. In another example implementation, the second operation includes writing the second data value to a different redundancy cell than the redundancy cell that stored the data value in the most recent write operation to the memory cell having the selected address.

Bit lines in the array 160 are coupled to a page buffer 140. The page buffer 140 can include a sense amplifier and one or more storage elements such as program buffers or latches for each bit line connected. Page buffer 140 can store data that is written to or read from these specific memory cells.

Peripheral circuitry in the memory device 175 includes logic circuits or analog circuits that are not part of the array 160, such as address decoder 150 and controller 169. In this example, block 174 labeled "other peripheral circuitry" can include input-output (I/O) circuits, bias supply voltage circuits, and other circuit components on the memory device 175, such as a general purpose processor or special-purpose application circuitry, or a combination of modules providing system-on-a-chip functionality supported by the array 160.

The memory device 175 can interface with a host system based on a suitable interface protocol. In one example, the memory device 175 can interface with a host system using serial peripheral interface bus (SPI) connections.

Controller 169, implemented in one example as a state machine, provides signals to control other circuits of the memory device 175 to carry out the various operations described herein. These operations can include program operations, erase operations, read operations, and redundancy operations for a flash memory.

Controller 169 can be implemented using special-purpose logic circuitry as known in the art. In other embodiments, controller 169 comprises a general purpose processor, which may be implemented on the same memory device 175, which executes a computer program to control the operations of the device. In yet other embodiments, a combination of special purpose logic circuitry and a general purpose processor may be utilized for implementation of the controller.

Figure 2:
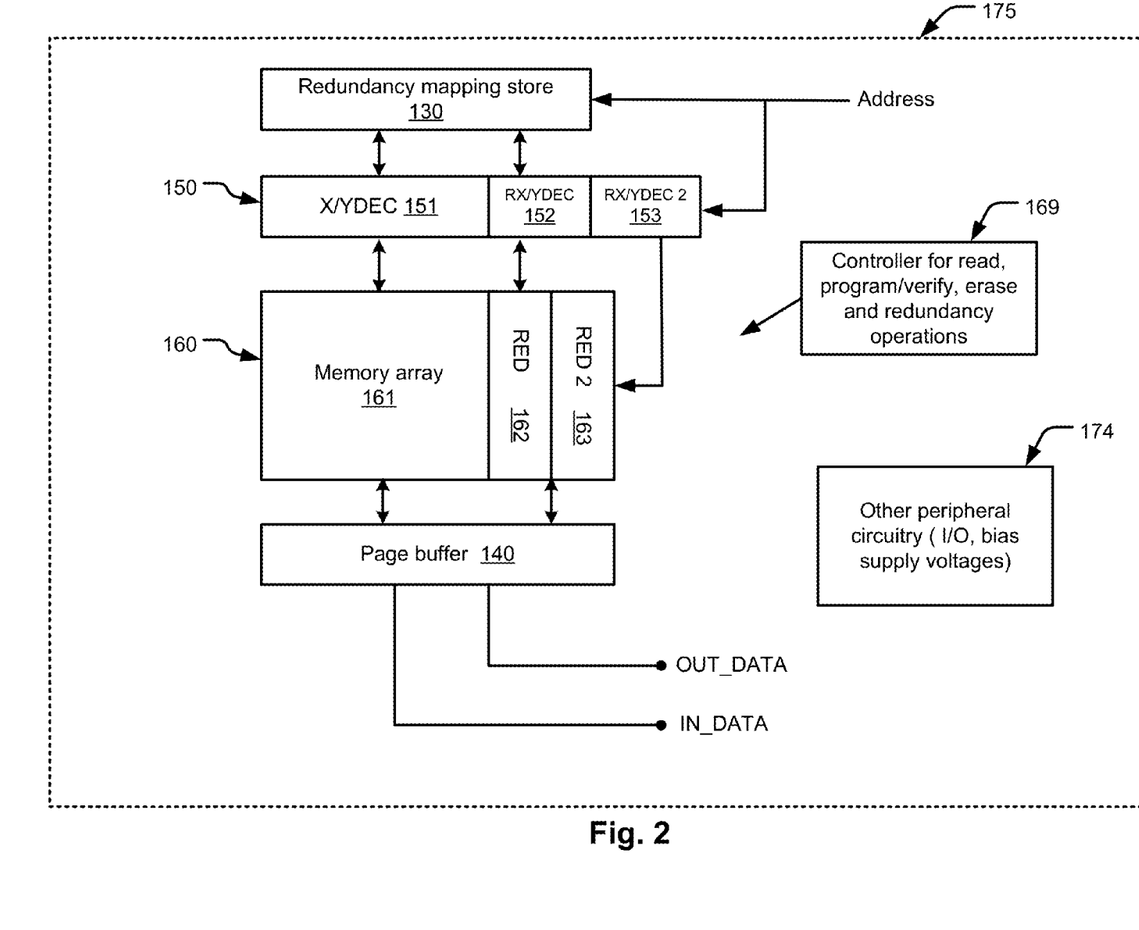
FIG. 2 is a block diagram of a memory device according to alternative embodiment of the present invention.

FIG. 2 is a simplified block diagram of a second embodiment of memory device 175. In this embodiment, memory device 175 includes an array 160 which comprises a memory array 161, a redundancy array 162 (RED), and a second redundancy array 163 (RED 2).

Permanent defective memory cells may result from structural defects, such as bad contacts between electrodes and memory elements, or irregular shapes, and these cells can be inspected and identified during the manufacturing process. Temporary defective memory cells may result from an incomplete SET/RESET operation, and these cells can pass verify during inspection and therefore not be identified during the manufacturing process. Herein, 'hard fail bits' refer to permanent defective memory cells, and 'soft fail bits' refer to temporary defective memory cells. In one example, hard fail bits in the memory array 161 are replaced with the redundancy cells in the second redundancy array 163 (RED 2), and soft fail bits of the memory array are replaced with the redundancy cells in redundancy array 162 (RED). In this example, the redundancy cells available for substitution for hard and soft fail bits of the memory array are in two different redundancy arrays (RED and RED 2).

Soft fail bits and respective addresses in the memory array 161 are mapped to the redundancy cells and the corresponding addresses of the redundancy cells in the redundant array 162. Hard fail bits and respective addresses in the memory array 161 are mapped to the redundancy cells and a corresponding address in second redundant array 163.

In one example, addresses of temporary defective cells (soft fail bits) in the memory array 161 and corresponding addresses of redundancy cells in the redundancy array 162 are determined and stored in redundancy mapping store 130. Addresses of permanently defective cells (hard fail bits) in the memory array 161 and corresponding addresses of redundancy cells in the second redundancy array 163 are also determined and stored in redundancy mapping store 130. The redundancy mapping store 130 has entries to map addresses of memory cells (hard and soft fail bits) in the memory array 161 to addresses of redundancy cells in the redundancy array 162 and redundancy array 163, respectively.

In another example, a second redundancy mapping store (not shown) is implemented so as to determine and store addresses of permanent defective cells (hard fail bits) in the memory array 161 and corresponding addresses of redundancy cells in the second redundancy array 163. In this example, the redundancy mapping store 130 has entries to map addresses of memory cells (soft fail bits) in the memory array 161 to addresses of redundancy cells in the redundancy array 162, and the second redundancy mapping store has entries to map addresses of memory cells (hard fail bits) in the memory array 161 to the addresses of redundancy cells in the second redundancy array 163. The second redundancy mapping store comprises a content addressable memory, look-up table, redundancy table or register bank.

An address decoder 150 is coupled to the array 160, and includes memory address decoders 151 (X/YDEC), redundancy address decoders 152 (RX/YDEC), and second redundancy address decoders 153 (RX/YDEC 2), decoding the supplied addresses and selecting corresponding cells in the array 160. Addresses can be supplied to, or produced on the memory device 175 and provided to the address decoder 150.

Address decoder 150 is also coupled to the redundancy mapping store 130. In one example, the redundancy address decoder 152 (RX/YDEC) and the second redundancy address decoders 153 (RX/YDEC 2) can both be coupled to redundancy mapping store 130, so that redundancy mapping store 130 has entries to map addresses of memory cells (hard fail bits and soft fail bits) to addresses of the plurality of redundancy cells in the redundancy array 162 and the second plurality of redundancy cells in second redundancy array 163. Address decoder 150 performs the address lookup function using the contents of redundancy mapping store 130.

In another example, second redundancy array 163 is implemented for hard fail bits specifically. Redundancy address decoders 152 (RX/YDEC) are coupled to the redundancy mapping store 130 which has entries to map addresses of memory cells (soft fail bits) to addresses of redundancy cells in the redundancy array 162, and the second redundancy address decoders 153 (RX/YDEC 2) are coupled to the second redundancy mapping store (not shown), which has entries to map addresses of memory cells (hard fail bits) to addresses of the second plurality of redundancy cells in the second redundancy array 163.

Circuitry included in the memory device 175 is coupled to the array 160, and can execute a write operation and a read operation in response to respective commands. The write operation includes writing a data value having a selected address in memory array 161—whether or not there is a valid entry for the selected address in redundancy mapping store 130; and applying a write/verify cycle to a memory cell in memory array 161 having the selected address. If the selected memory cell fails verify, then the circuitry writes the data value to a redundancy cell in the redundancy array and updates, changes or writes an entry to the redundancy mapping store to map the selected address to the redundancy cell. The read operation includes reading a data value having a selected address from the memory array 161—if there is no valid entry for the selected address in the redundancy mapping store 130; or reading a data value from the redundancy array 162 if there is a valid entry in the redundancy mapping store 130 for the selected address.

The write operation further includes removing or marking invalid any entry in the redundancy mapping store 130 for the selected address, if the selected memory cell passes verify. Thus, the redundancy cell mapped to the selected address can be used to store another data value for a different address. In a subsequent write operation to the selected address in the memory array, the circuitry applies a write/verify cycle to the memory cell in the memory array having the selected address, and if the selected memory cell passes verify, then removes the entry or marks the entry invalid in the redundancy mapping store for the selected address. This way, a cell previously replaced by a redundant cell can be restored to normal operation.

A second write operation includes writing a second data value having the same selected address as the most recent write operation in the memory array 161 whether or not there is a valid entry for the selected address in the redundancy mapping store 130; and applying a write/verify cycle to the memory cell in the memory array 161 having the selected address. In one example, if the selected memory cell fails verify, the second write operation includes writing the second data value to the same redundancy cell that stored the data value in the most recent write operation to the selected address. In another example, the second operation includes writing the second data value to a different redundancy cell than the cell that stored the data value in the most recent write operation to the selected address. The redundancy cells in the redundancy array are re-writable and store data values for the same or different selected addresses in the memory array as compared to previous write operations. Also, the redundancy mapping store can include re-writable memory, so that entries can be changed, deleted, marked valid or invalid, and otherwise used to modify the mapping.

Figure 3:
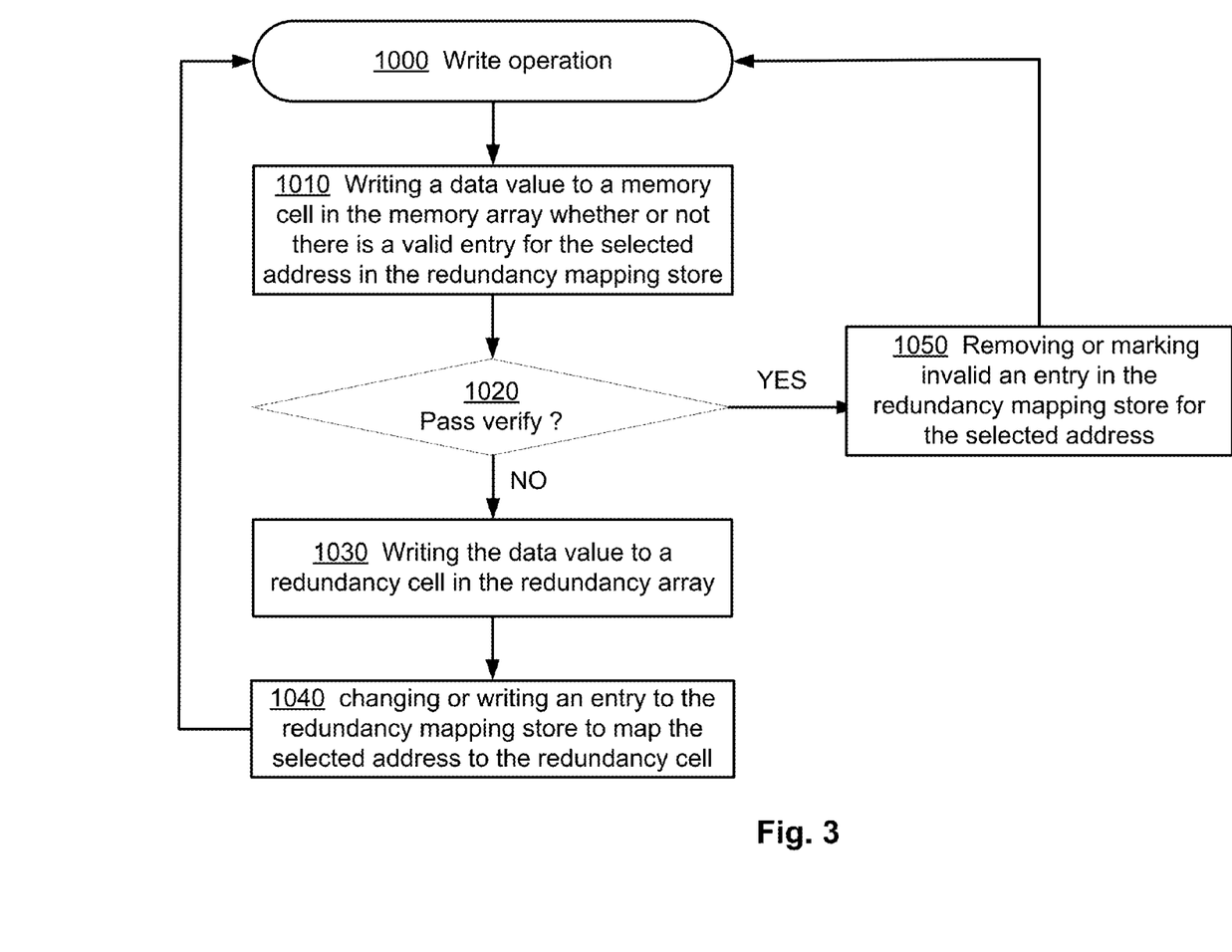
FIG. 3 is a flow chart of a write operation of a memory.

FIG. 3 is a flow chart of a write operation of a memory device according to one embodiment of the present invention. The memory device comprises a memory array having a plurality of memory cells, a redundant array having a plurality of redundancy cells, a redundancy mapping store having entries to map addresses of memory cells in the memory array to addresses of redundancy cells, and circuitry coupled to the memory array and the redundancy array. Write operation 1000 starts with writing a data value having a selected address in the memory array, whether or not there is a valid entry for the selected address in the redundancy mapping store (block 1010). Then, a verify operation is executed by applying a write/verify cycle to a memory cell in the memory array having the selected address (block 1020). If the selected memory cell passes verify, the write operation includes removing or marking invalid an entry in the redundancy mapping store for the selected address (block 1050). If the selected memory cell fails verify, then the write operation includes writing the data value to a redundancy cell in the redundancy array (block 1030), and then changing or writing an entry to the redundancy mapping store to map the selected address to the redundancy cell (block 1040). In the circumstance that the memory cell having the selected address fails verify, a subsequent write operation to the selected address in the memory array includes applying a write/verify cycle to the memory cell in the memory array having the selected address, and if the selected memory cell passes verify, then removing or marking invalid the entry in the redundancy mapping store for the selected address.

Figure 4:
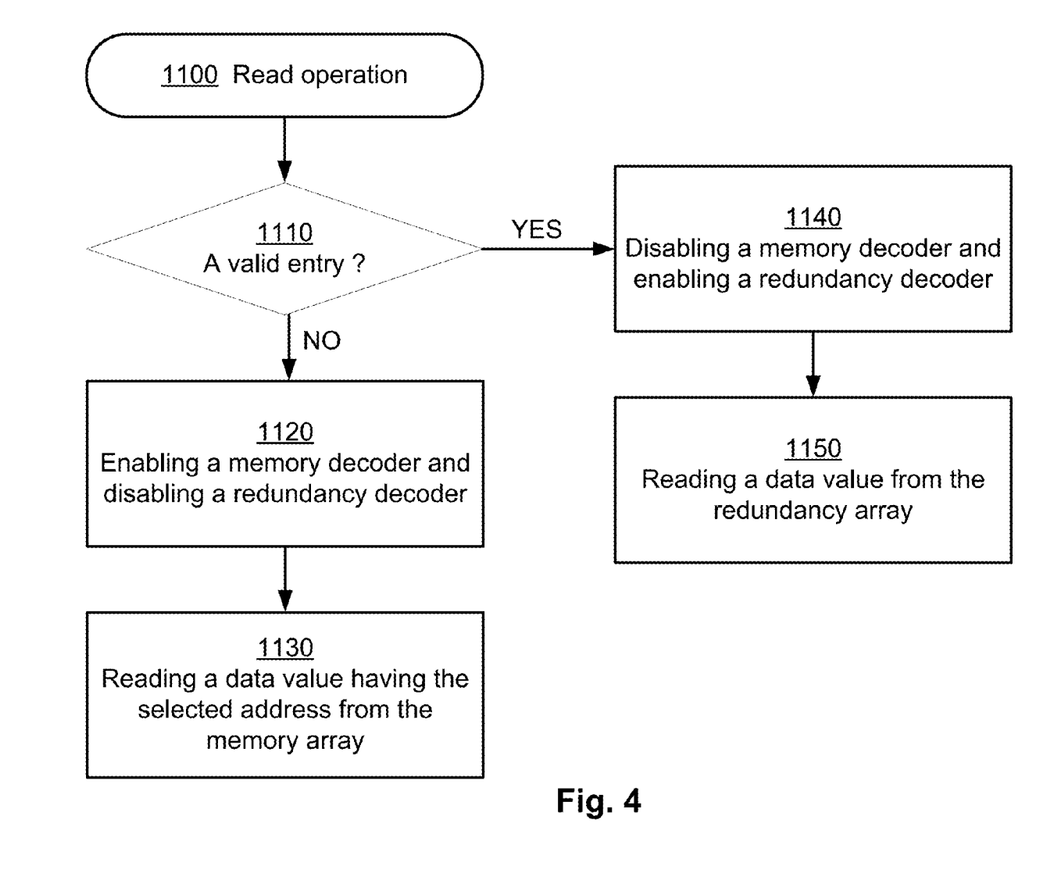
FIG. 4 is a flow chart of a read operation of a memory.

FIG. 4 is a flow chart of a read operation of the memory device. The read operation 1100 starts by checking whether there is a valid entry for the selected address in the redundancy mapping store (block 1110). If there is no valid entry for the selected address in the redundancy mapping store, a data value having the selected address from the memory array will be read from the memory array (block 1130) by enabling a memory decoder and disabling a redundancy decoder (block 1120). If there is a valid entry for the selected address in the redundancy mapping store, a data value will be read out from the redundancy array mapped to the selected address (block 1150) by disabling a memory decoder and enabling a redundancy decoder (block 1140).

Figure 5:
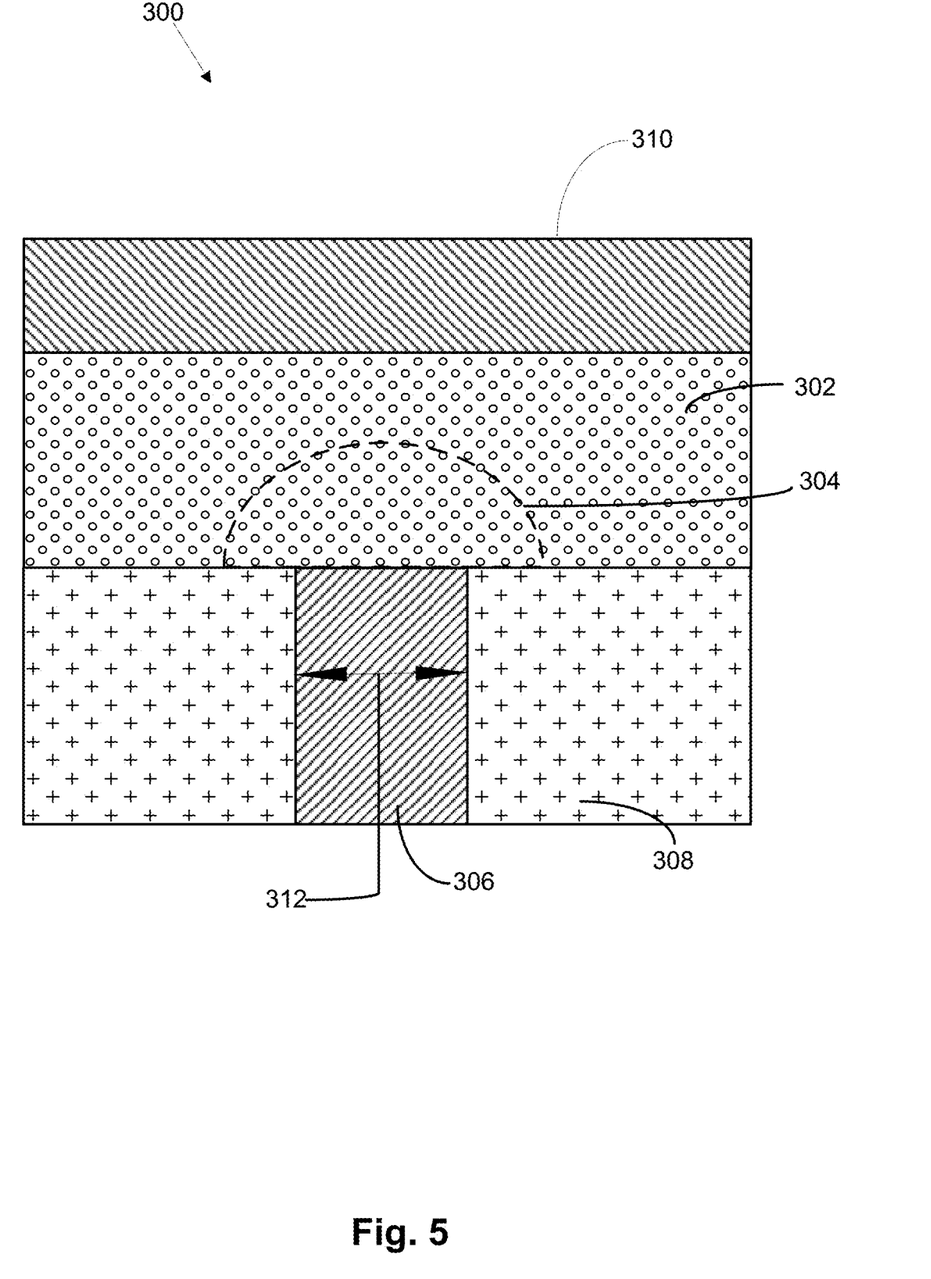
FIG. 5 is a cross-sectional view of a phase change memory cell.
Figure 6:
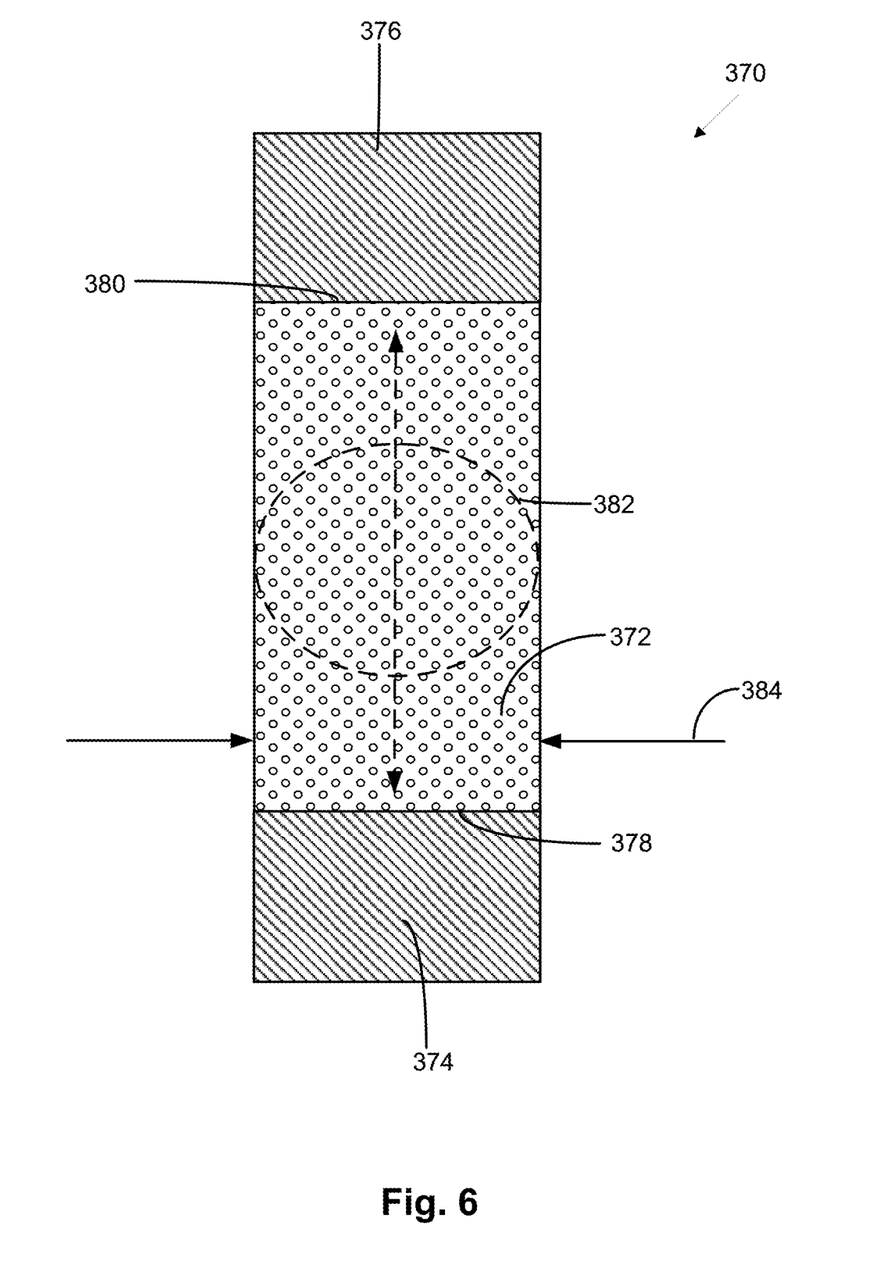
FIG. 6 is a cross-sectional view of an alternative phase change memory cell design.
Figure 7:
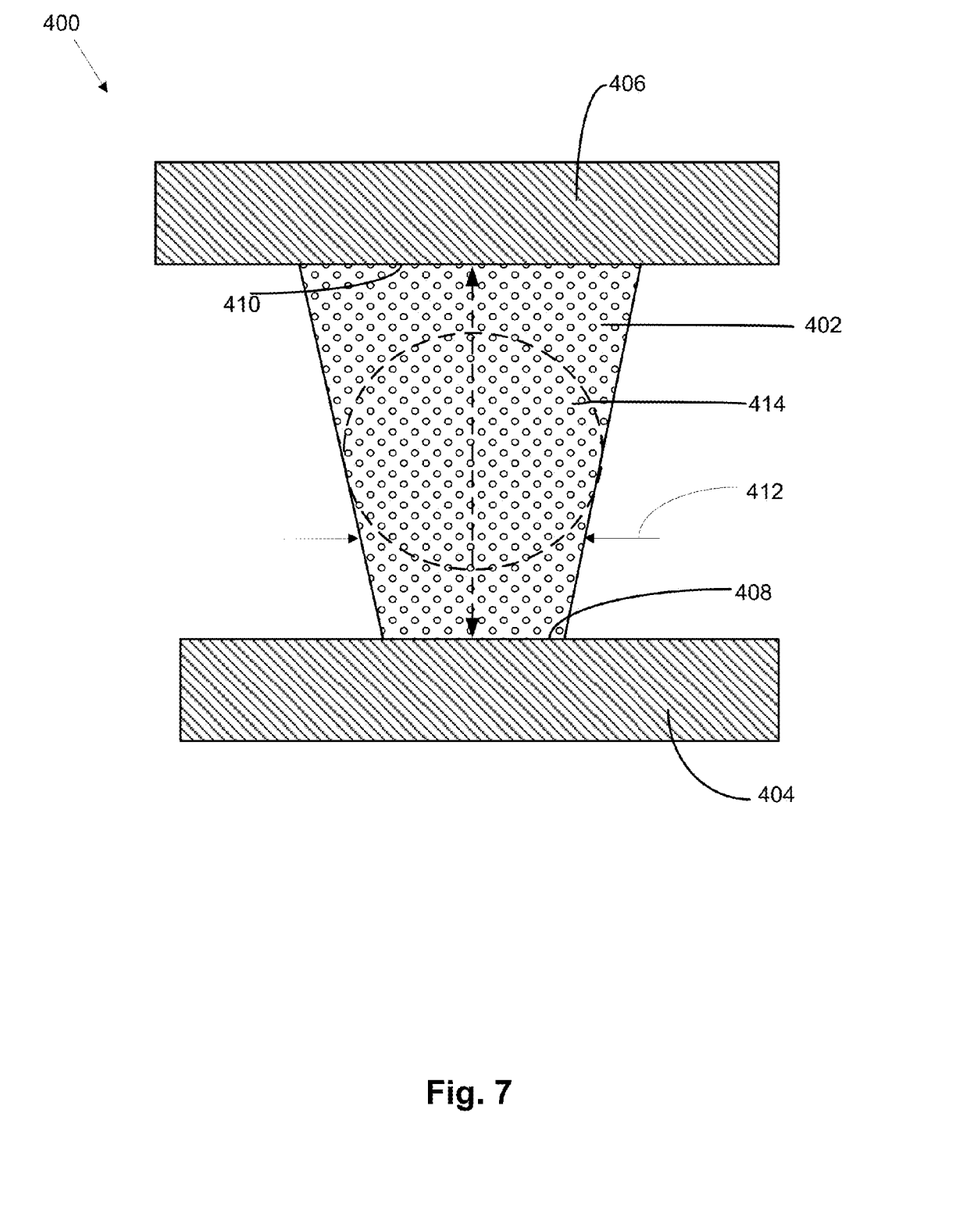
FIG. 7 is a cross-sectional view of an alternative phase change memory cell design.

FIG. 5, FIG. 6 and FIG. 7 illustrate various phase change memory cell designs which can be implemented with the present technology. Embodiments of the phase change materials include phase change based memory materials, including chalcogenide based materials and other materials. Chalcogens include any of the four elements oxygen (O), sulfur (S), selenium (Se), and tellurium (Te), which form part of group VIA of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from group IVA of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable, such as Ge2Sb2Te5, GeSb2Te4 and GeSb4Te7. More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistance properties. Similarly, in the family of Ga/Sb/Te alloys, a wide range of alloy compositions are workable.

Chalcogenides and other phase change materials are doped with impurities, in some embodiments, to modify conductivity, transition temperature, melting temperature, crystallization temperature, and other properties of memory elements using the doped chalcogenides. Representative impurities used for doping chalcogenides include nitrogen, silicon, oxygen, silicon dioxide, silicon nitride, copper, silver, gold, aluminum, aluminum oxide, tantalum, tantalum oxide, tantalum nitride, titanium and titanium oxide.

Phase change alloys are capable of being switched between a first structural state in which the material is in a generally amorphous solid phase, and a second structural state in which the material is in a generally crystalline solid phase in its local order in the active channel region of the cell. These alloys are at least bistable.

FIG. 5 illustrates a cross-sectional view of a memory cell 300 that is fabricated from a phase change material. Memory cell 300 comprises a memory element 302 consisting of a body of memory material. Memory cell 300 includes an active region 304. The memory cell 300 includes a first electrode 306 extending through dielectric layer 308 to Contact a bottom surface of the memory element 302. A second electrode 310 is formed on the memory element 302 to create a current between the first electrode 306 and second electrode 310 through the memory element 302. The first and second electrodes 306 and 310 may comprise, for example, TiN or TaN. Alternatively, the first and second electrodes 306 and 310 may each be W, WN, TiAlN or TaAlN, or comprise, for further examples, one or more elements selected from the group consisting of doped-Si, Si, C, Ge, Cr, Ti, W, Mo, Al, Ta, Cu, Pt, Ir, La, Ni, N, O, and Ru and combinations thereof. The dielectric layer 308 may comprise silicon nitride, silicon oxynitride, silicon oxide and any other suitable dielectric material.

The described memory cell has a first electrode 306 with a relatively narrow width 312 (which in some embodiments is a diameter). The narrow width 312 of the first electrode 306 results in an area of contact between the first electrode 306 and the memory element 302 that is less than the area of contact between the memory element 302 and the second electrode 310. Thus, current is concentrated in the portion of the memory element 302 adjacent the first electrode 306, resulting in the active region 304 being in contact with or near the first electrode 306, as shown. The memory element 302 also includes an inactive region outside the active region 304, which is inactive in the sense that it does not undergo phase transitions during operation.

FIG. 6 illustrates a cross-sectional view of an alternative memory cell 370 design. Memory cell 370 includes a memory element 372 consisting of a body of phase change in an inter-electrode current path through memory element 372. Memory element 372 is in a pillar shape and contacts first electrode 374 and second electrode and 376 at top surface 380 and surface 378, respectively. The memory element 372 has a width 384 substantially the same as that of the first electrode 374 and second electrode 376, to define a multi-layer pillar surrounded by dielectric (not shown). As used herein, the term "substantially" is intended to accommodate manufacturing tolerances. In operation, as current passes between first electrode 374 and second electrode 376 and through memory element 372, active region 382 heats up more quickly than the other regions within the memory element. This leads to a majority of the phase transformation occurring within the active region during device operation.

FIG. 7 illustrates a cross-sectional view of an alternative memory cell 400 design. The memory cell 400 includes a memory element 402 consisting of a body of phase change material in an inter-electrode current path through the memory element 402. The memory element 402 is surrounded by dielectric (not shown) contacting top surface 408 of first electrode 404 and contacting bottom surface 410 of second electrode 406. Memory element 402 has a varying width 412 that is less than the width of the first and second electrodes. In operation, as current passes between first electrode 404 and second electrode 406 and through memory element 402, active region 414 heats up more quickly than the remainder of the memory element. Thus the volume of memory element 402 within the active region is where a majority of the phase transformation occurs during device operation.

Figure 8:
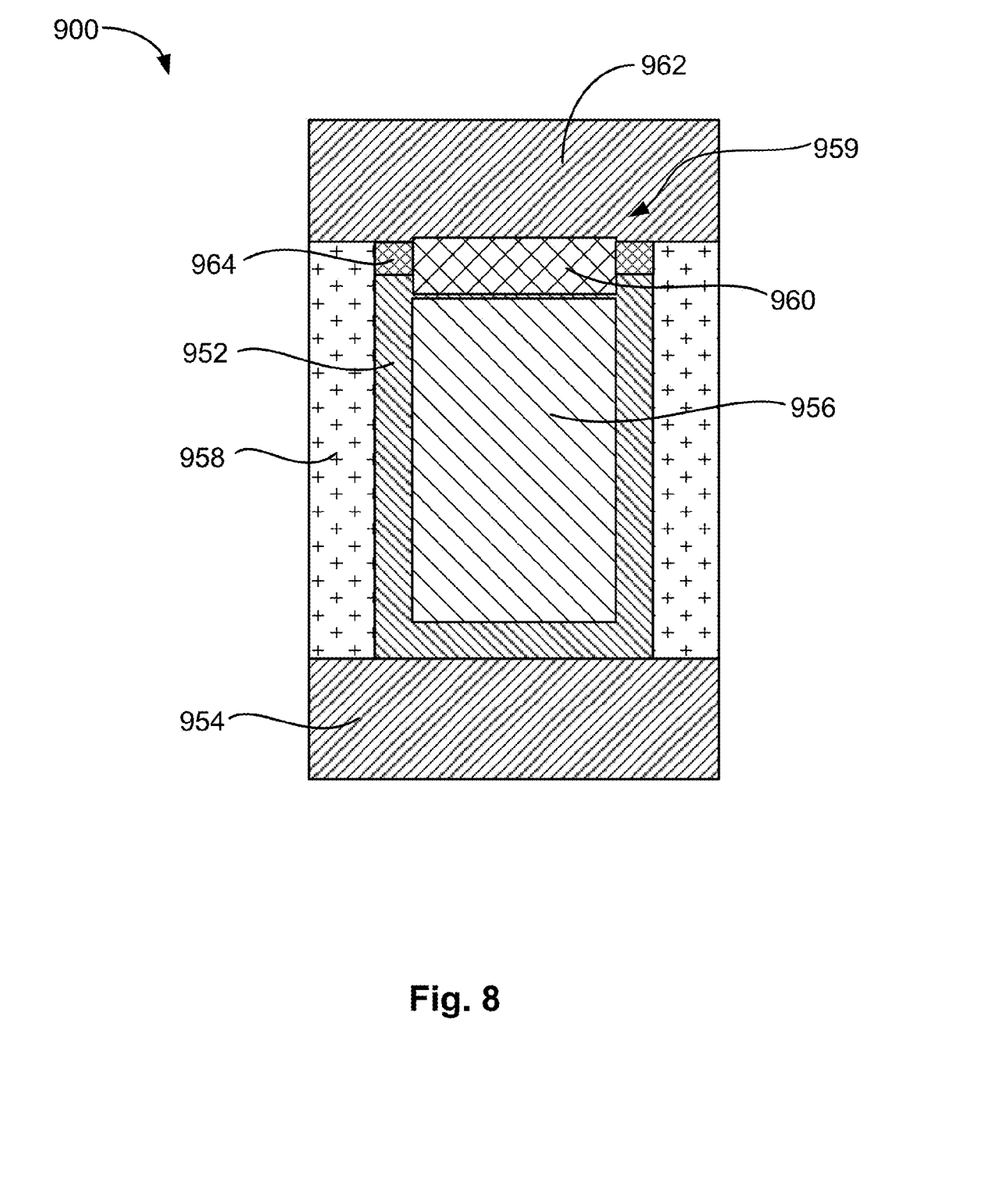
FIG. 8 is a cross-sectional view of a metal-oxide memory cell.

FIG. 8 illustrates a cross-sectional view of a metal-oxide memory cell 900 that can be implemented with the present technology as described. The memory cell 900 includes a liner layer 952 between a bottom electrode 954 and a conductive element 956. The conductive element 956 is surrounded by the liner layer 952 and extends through a dielectric 958 to contact a memory element 959, which includes a metal-oxide layer 960 and metal oxide ring 964. A top electrode 962 is on the memory element 959. As shown in FIG. 8, metal oxide ring 964 of the memory element 959 at the end of liner layer 952 induces a field enhancement effect. The dielectric 958 contacts the metal oxide ring 964 of the memory element 960, and acts as a capping layer. The top electrode 962 is electrically conductive which, in some embodiments, is a portion of a bit line. The top electrode 962 may comprise, for example, one or more elements selected from the group consisting of Ti, W, Yb, Tb, Y, Sc, Hf, Zr, Nb, Cr, V, Zn, Re, Co, Rh, Pd, Pt, Mo, Al, Ta, Cu, Pt, Ir, La, Ni, N, O, and Ru and combinations thereof. In some embodiments, top electrode 962 may comprise more than one layer of material.

Bottom electrode 954 is an electrically conductive element. The bottom electrode may, for example, comprise doped polysilicon, which may be the terminal of a diode or access transistor. Alternatively, bottom electrode 954 may comprise, for example, any of the materials discussed above with reference to top electrode 962.

Conductive element 956 may comprise, for example, any of the materials discussed above with reference to top electrode 962.

Metal-oxide layer 960 comprises metal-oxide material which is programmable to a plurality of resistance states. In some embodiments, metal-oxide layer 960 may comprise one or more metal oxides from the group of tungsten oxide, titanium oxide, nickel oxide, aluminum oxide, copper oxide, zirconium oxide, niobium oxide, tantalum oxide, titanium nickel oxide, Cr-doped SrZrO3, Cr-doped SrTiO3, PCMO and LaCaMnO. In some embodiments, the memory element 959 may comprise WO/Cu or Ag, TiO/Cu or Ag, NiO/Cu or Ag, AlO/Cu or Ag, CuO/Cu or Ag, ZrO/Cu or Ag, NbO/Cu or Ag, TaO/Cu or Ag, TiNO/Cu or Ag, Cr-doped SrZrO3/Cu or Ag, Cr-doped SrTiO3/Cu or Ag, PCMO/CU or Ag, LaCaMnO/Cu or Ag, and SiO2/Cu or Ag.

Liner layer 952 may comprise, for example, a layer of TiN or a bi-layer of silicon nitride and TiN. Other materials can be used for liner layer 952 as well.

As shown in FIG. 8, metal-oxide ring 964 surrounds metal-oxide layer 960 at the level at which contact to top electrode 962 is made. Metal-oxide ring 964 may, for example, comprise TiNOx, SiO2, HfOx, TiNOx, TiOx, AlOx, WOx, etc., and is preferably chosen so that the material of the metal-oxide ring 964 has a higher resistance than that of central portion of the memory element 959, that is metal-oxide layer 960.

In the illustrated embodiment conductive element 956 comprises tungsten, metal-oxide layer 960 of tungsten oxide, metal oxide ring 964 of TiNOx, and the liner layer 952 comprises TiN or a bi-layer of silicon nitride and TiN.

In addition to memory cells, such as phase change memory cells and metal oxide memory cells, described above, solid state electrolyte (conductive bridge) memory cells and magnetoresistive memory cells can be applicable to the present technology.

While the present technology is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the technology and the scope of the following claims.

What is claimed is:

1. A memory device, comprising:
   a memory array having a plurality of memory cells;
   a redundancy array having a plurality of redundancy cells;
   a redundancy mapping store having entries to map addresses of memory cells in the memory array to addresses of redundancy cells; and
   circuitry coupled to the redundancy array and the memory array, which executes a write operation in response to a write command,
      the write operation writing a data value having a selected address in the memory array whether or not there is a valid entry for the selected address in the redundancy mapping store, applying a write/verify cycle to a memory cell in the memory array having the selected address, and if the selected memory cell fails verify, then writing the data value to a redundancy cell in the redundancy array and changing or writing an entry to the redundancy mapping store to map the selected address to the redundancy cell.

2. The memory device of claim 1, including if the selected memory cell passes verify in the write operation, then removing or marking invalid an entry in the redundancy mapping store for the selected address.

3. The memory device of claim 1, in a subsequent write operation to the selected address in the memory array, applying a write/verify cycle to the memory cell in the memory array having the selected address, and if the selected memory cell passes verify, then removing or marking invalid the entry in the redundancy mapping store for the selected address.

4. The memory device of claim 2 wherein the redundancy cell mapped to the selected address can be used to store another data value for a different address.

5. The memory device of claim 1 further comprising a memory address decoder and a redundancy address decoder coupled to the memory array and the redundancy array, respectively.

6. The memory device of claim 1, wherein the redundancy mapping store is coupled to a memory address decoder and a redundancy address decoder.

7. The memory device of claim 1, wherein a second write operation includes writing a second data value having the selected address in the memory array, whether or not there is a valid entry for the selected address in the redundancy mapping store, applying a write/verify cycle to the memory cell in the memory array having the selected address, and if the selected memory cell fails verify, then writing the second data value to a redundancy cell which can be the same as or different than the redundancy cell stored the data value.

8. The memory device of claim 1 further comprising a second mapping store having entries to map addresses of hard fail bits in the memory array to addresses of redundancy cells in a second redundancy array.

9. The memory device of claim 8, wherein the redundancy cells in the redundancy array are available for substitution for soft fail bits in the memory array, and the redundancy cells in a second redundancy array are available for substitution for hard fail bits in the memory array.

10. The memory device of claim 8 further comprising a second redundancy address decoder coupled to the second redundancy array.

11. A method of writing a memory device including a memory array having a plurality of memory cells, a redundant array having a plurality of redundancy cells, and redundancy mapping store having entries to map addresses of memory cells in the memory array to addresses of redundancy cells, the method comprising:

writing a data value having a selected address in the memory array whether or not there is a valid entry for the selected address in the redundancy mapping store, applying a write/verify cycle to a memory cell in the memory array having the selected address, and if the selected memory cell fails verify, then writing the data value to a redundancy cell in the redundancy array and changing or writing an entry to the redundancy mapping store to map the selected address to the redundancy cell.

12. The method of claim 11 further comprising if the selected memory cell passes verify in the write operation, then removing or marking invalid an entry in the redundancy mapping store for the selected address.

13. The method of claim 11, in a subsequent write operation to the selected address in the memory array, applying a write/verify cycle to the memory cell in the memory array having the selected address, and if the selected memory cell passes verify, then removing or marking invalid the entry in the redundancy mapping store for the selected address.

14. The method of claim 11 wherein the redundancy cell mapped to the selected address can be used to store another data value for a different address.

15. The method of claim 11 further comprising disabling a memory decoder coupled to the memory array and enabling a redundancy decoder coupled to the redundancy array if there is a valid entry for the selected address in the redundancy mapping store.

16. The method of claim 11, wherein the memory device further comprises a second plurality of redundancy cells in a second redundancy array.

17. The method of claim 16, wherein the memory device further comprises a second redundancy address decoder coupled to the second redundancy array.

18. The method of claim 11, wherein the plurality of redundancy cells in the redundancy array are available for substitution for soft fail bits in the memory array.

19. The method of claim 16, wherein the second plurality of redundancy cells in the second redundancy array are available for substitution for hard fail bits in the memory array.

20. The method of claim 11 further comprising a second mapping store having entries to map addresses of hard fail bits in the memory array to addresses of redundancy cells in a second redundancy array.

* * * * *